US011490541B2

(12) United States Patent
Mason

(10) Patent No.: US 11,490,541 B2
(45) Date of Patent: Nov. 1, 2022

(54) BUILDING MANAGEMENT SYSTEM CONTAINER AND SKIDS

(71) Applicant: DAEDALUS INDUSTRIAL LLC, Easley, SC (US)

(72) Inventor: Matthew Mason, Easley, SC (US)

(73) Assignee: DAEDALUS INDUSTRIAL LLC, Easley, SC (US)

( * ) Notice: Subject to any disclaimer, the term of this patent is extended or adjusted under 35 U.S.C. 154(b) by 283 days.

(21) Appl. No.: 16/775,870

(22) Filed: Jan. 29, 2020

(65) Prior Publication Data
US 2021/0235595 A1    Jul. 29, 2021

(51) Int. Cl.
*H05K 7/20* (2006.01)
*H05K 7/14* (2006.01)
*E04B 1/348* (2006.01)
*B65D 90/00* (2006.01)
*B65D 88/12* (2006.01)

(52) U.S. Cl.
CPC ......... *H05K 7/1497* (2013.01); *B65D 88/121* (2013.01); *B65D 90/008* (2013.01); *E04B 1/34869* (2013.01); *H05K 7/1465* (2013.01); *H05K 7/1467* (2013.01)

(58) Field of Classification Search
CPC .. B65D 88/121; B65D 90/008; H05K 7/1497; H05K 7/1465; H05K 7/1467; E04B 1/34869
USPC ........................................ 220/1.5; 312/223.2
See application file for complete search history.

(56) References Cited

U.S. PATENT DOCUMENTS

| 9,104,387 | B1 | 8/2015 | Eichelberg |
| 2004/0029617 | A1 | 2/2004 | Flynn |
| 2009/0198388 | A1* | 8/2009 | Hillis ............... H05K 7/20745 267/140.11 |
| 2012/0013141 | A1 | 1/2012 | Cheng |
| 2012/0104919 | A1 | 5/2012 | Wu |
| 2012/0140415 | A1 | 6/2012 | Driggers |
| 2012/0155027 | A1 | 6/2012 | Broome et al. |
| 2012/0200992 | A1 | 8/2012 | Schmitt et al. |
| 2013/0083476 | A1 | 4/2013 | Clidaras et al. |

(Continued)

FOREIGN PATENT DOCUMENTS

CN    203486492 U    3/2014

OTHER PUBLICATIONS

International Search Report and Written Opinion for International Application No. PCT/US21/13901 dated Apr. 6, 2021; 7 pages.

*Primary Examiner* — Don M Anderson
*Assistant Examiner* — Elizabeth J Volz
(74) *Attorney, Agent, or Firm* — Nelson Mullins Riley & Scarborough LLP

(57) ABSTRACT

The invention is directed to a portable container system comprising a container which comprises a floor, four upwardly-extending sidewalls, wherein at least one of the sidewalls is hinged to allow the at least one sidewall to open outwardly, and a top wall. The system also comprises a plurality of skids contained within the container. Each skid comprises a base and one or more upwardly extending members; and one or more cabinets mounted on the base or one or more upwardly extending members, wherein the one or more cabinets comprise: control power distribution panel cabinets, human-machine interface cabinets, programmable logic controller-redundancy cabinets, network cabinets, or remote I/O cabinets.

19 Claims, 7 Drawing Sheets

(56) References Cited

U.S. PATENT DOCUMENTS

| | | |
|---|---|---|
| 2014/0298734 A1 | 10/2014 | Rogers |
| 2014/0307384 A1 | 10/2014 | Best |
| 2015/0028617 A1 | 1/2015 | Slessman |
| 2015/0076975 A1 | 3/2015 | Peng et al. |
| 2016/0079741 A1 | 3/2016 | Englert et al. |
| 2016/0273271 A1 | 9/2016 | Morrell et al. |
| 2019/0261534 A1 | 8/2019 | Jochim et al. |

\* cited by examiner

BUILDING MANAGEMENT SYSTEM CONTAINER AND SKIDS

FIELD OF THE INVENTION

The present invention relates generally to a container, skids, and a containment system that are used in connection with a building management system.

BACKGROUND

Mission critical facilities, such as data centers, airports, stadiums, and hospitals have a critical reliance on the functionality of their building management systems (BMS). The key functions of a building management system in these industries is to monitor and control essential services in the facility, including power (primary and secondary), environment (HVAC, chillers), fire suppression systems, and security systems. These services are crucial to the success of these facilities and, as such, redundant BMS sources are often used. The utilization and change between primary and secondary sources (i.e. in the case of failures or upgrades) must be seamless, as constant monitoring is essential to the facility.

Historically, however, BMS hardware systems are scattered throughout a facility, leaving essential hardware decentralized and making upgrades difficult and time consuming. In the case of technology failures, maintenance, or necessary upgrades due to technology obsolescence, for example, facilities have historically had to manage, repair, and replace scattered equipment and systems throughout their facility in a controlled manner. This method of repair and maintenance carries a high risk that one or more of the systems (power, environment, fire suppression, or security) may be offline or disabled for some period of time, a result which would be detrimental for mission critical facilities. In an effort to minimize this risk, the necessary upgrades are undertaken piecemeal and slowly and may take months to accomplish, depending on the size of the facility and the complexity of the BMS system.

Through hard work and ingenuity, the inventors have developed a BMS system which avoids or minimizes the risk of system failures and significantly reduces the time to repair or upgrade a facility. The inventive BMS system allows hardware manufacturing, repairs, and/or upgrades to be performed off-site, shipped to a facility, and quickly replaced without negatively impacting the primary operations of the facility.

BRIEF DESCRIPTION OF THE DRAWING(S)

Having thus described the disclosure in general terms, reference will now be made to the accompanying drawings, which are not necessarily drawn to scale, and wherein:

SUMMARY

Figure 1A:
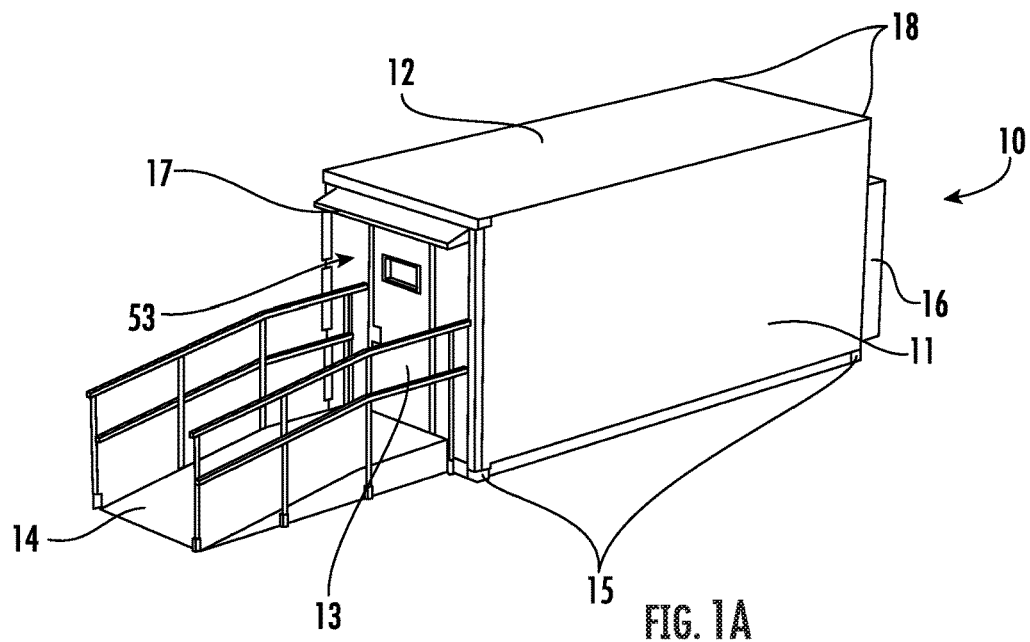
FIGS. 1A and 1B are perspective drawings of an exemplary container in an embodiment of the present invention.

In an aspect, the invention is directed to a portable container system comprising a container which comprises a floor, four upwardly-extending sidewalls, wherein at least one of the sidewalls is hinged to allow the at least one sidewall to open outwardly, and a top wall. The system also comprises a plurality of skids contained within the container. Each skid comprises a base and one or more upwardly extending members; and one or more cabinets mounted on the base or one or more upwardly extending members, wherein the one or more cabinets comprise: control power distribution panel cabinets, human-machine interface cabinets, programmable logic controller-redundancy cabinets, network cabinets, or remote I/O cabinets.

In another aspect, the invention comprises a portable container system comprising a container which comprises a floor, four upwardly-extending sidewalls, wherein at least one of the sidewalls is hinged to allow the at least one sidewall to open outwardly, and a top wall. The system also comprises a plurality of skids disposed within the container, each skid of the plurality of skids having a first end and a second, horizontally opposite end, a base, and one or more upwardly extending members. A first skid is disposed adjacent the hinged sidewall and comprises a programmable logic controller-redundancy cabinet and a network cabinet each mounted on the first end of the first skid and a control power distribution panel cabinet mounted on the second end of the first skid. At least one second skid is disposed adjacent the first skid and comprises at least one remote I/O cabinet mounted on the first end of the second skid and at least one remote I/O cabinet mounted on the second end of the second skid. A third skid is disposed furthest from the hinged sidewall and comprises at least one remote I/O cabinet mounted on the first end of the third skid and a control power distribution panel cabinet mounted on the second end of the third skid.

In another aspect the invention comprises a portable container system comprising a container which comprises a floor, four upwardly-extending sidewalls, wherein at least one of the sidewalls is hinged to allow the at least one sidewall to open outwardly, and a top wall. The system additionally comprises a plurality of skids disposed within the container, each skid of the plurality of skids having a first end and a second, horizontally opposite end, a base, and one or more upwardly extending members. A first skid is disposed adjacent the hinged sidewall and comprises a programmable logic controller-redundancy cabinet and a network cabinet each mounted on the first end of the first skid and a control power distribution panel cabinet mounted on the second end of the first skid. At least one second skid is disposed adjacent the first skid and comprises at least one remote I/O cabinet mounted on the first end of the second skid and at least one remote I/O cabinet mounted on the second end of the second skid. A third skid is disposed furthest from the hinged sidewall and comprises at least one remote I/O cabinet mounted on the first end of the third skid and a programmable logic controller-redundancy cabinet mounted on the second end of the third skid.

DETAILED DESCRIPTION

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

In an embodiment, the invention comprises a self-contained, portable, on-demand storage, delivery and container system for building management/automation equipment, systems, and operations. In an embodiment, the invention may comprise a container, skid or system that houses BMS equipment and/or systems for a facility, site, structure, or zone. In an embodiment, the invention may be utilized in connection with facilities that are controlled and monitored within Data Center Infrastructure Management (DCIM) guidelines (i.e. data centers). In another embodiment, the invention may be utilized in healthcare facilities, hospitals, industrial complexes, sports stadiums, music or performance facilities, and/or in connection with any other mission-critical management and controls applications. In an embodiment, the invention is designed and adapted to be mounted or placed external to a building which is being controlled (i.e. on an exterior surface, such as a concrete pad or platform, or on a rooftop). In an embodiment, the inventive system is containerized, however, the system may also be provided in a non-containerized embodiment disposed and/or dispersed within a facility. For example, the inventive system could be disposed within a building management system controls room or on various skids positioned within and/or throughout a facility.

In an embodiment, the invention generally comprises a container which houses one or more skids. In an embodiment, each skid may be removably affixed to an internal track system. In an embodiment, the skid system is modular. In other embodiments, the skid system could be installed within a facility without the accompanying container. In either case, the skid system is designed to integrate with the existing facility control mechanisms, provide an easy-to-install system, and provide a system that is efficient to maintain. For example, skids can be added to or removed from the skid system at any time, as needs arise, repairs are required, systems are upgraded, or systems are eliminated. The inventive system reduces lead times and allows for future scalability and support of the integral BMS.

In some embodiments, the skid system comprises multiple steel sections which house various aspects of the BMS hardware. The skids can each be mounted on a continuous triangular track, in an embodiment, which allows them to each slide easily in and out of position. In another embodiment, wheels are mounted on each individual skid. In an embodiment, the skids are disposed adjacent one another. In a particular embodiment, the skids may connect to each other and lock into place. In an embodiment, some or all of the skids may be removed from the skid system or container without affecting the functionality of the remaining skids and their corresponding hardware. This allows change-out of faulty hardware without disruption of the entire system.

In an embodiment, each of the devices that the inventive system controls are hardwired to a single location where the inventive system resides, allowing for simple changeover to a new containerized system (built offsite, for example), a new single skid, or several new skids.

In an embodiment, the invention additionally comprises networking and power cables which connect the inventive system to the primary structure (i.e. the building being controlled). In an embodiment, the network and power cabling system utilizes quick connect technology, allowing for efficient changeover to the inventive system and, thereby, risk mitigation of downtime. In an embodiment, the inventive system provides the ability to construct and deploy a side-by-side, live, dual BMS. This allows the roll-over of redundant systems and machines into the new BMS, thereby mitigating and reducing the risk/threat of downtime.

Referring now to the drawings, and FIG. 1A particularly, the inventive system may comprise a container 10. The container 10 may comprise a floor and at least one wall 11 extending upwardly from the floor. The at least one wall 11 may comprise three or four walls, creating a container 10 having a generally square or rectangular configuration. However, any shape known in the art may be utilized in this embodiment. The upwardly extending walls 11 may terminated in a top wall 12 (or ceiling/roof), in an embodiment. In an embodiment, the roof 12 may be pitched to avoid standing water/snow/ice.

Figure 1B:
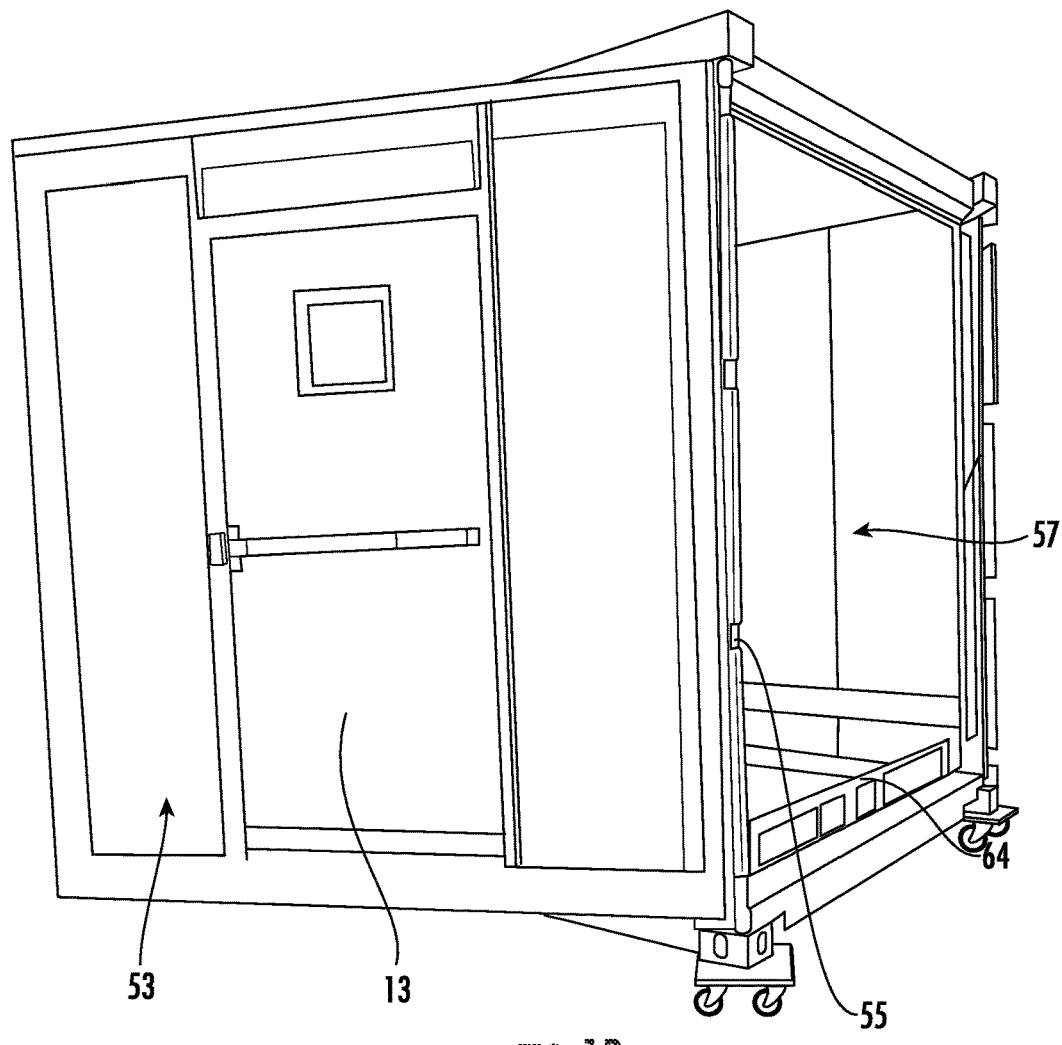

In an embodiment, at least one sidewall of the container 10 comprises a hinged wall 53 (see FIG. 1B). In an embodiment, the hinged wall 53 may comprise the width of the container 10. In an embodiment, the hinged wall 53 may comprise hinges 55 disposed adjacent another sidewall 11. In an embodiment, the hinged wall 53 may be opened to allow the installation of one or more skids within the container 10. Thus, in an embodiment, the hinged wall 53 is at least slightly wider than the corresponding dimension of a skid. In an embodiment, in an open configuration, the hinged wall 53 may provide skid access 57 into the interior of the container 10. In a closed configuration, the hinged wall 53 may seal the container 10 closed.

In an embodiment at least one door 13 may be disposed within at least one wall 11 of the container. In an embodiment, the door 13 may be disposed within the hinged wall 53. The door 13 may be sized for an adult human to pass therethrough and may itself be disposed on hinges. The door may be airtight. In an embodiment, the container system comprises a ramp 14, which may allow easy ingress and egress of skids and or heavy equipment that may require wheeled transportation. In other embodiments, the container 10 may be alternatively accessed via stairs.

In an embodiment, the container 10 may be mounted on lower corner castings 15 which, in an embodiment, are ISO compliant. Likewise, the container may comprise ISO-compliant upper corner castings 18, for lifting of the container 10 with a crane or for stacking of one container 10 atop a second container 10. In an embodiment, the container 10 may comprise one or more air conditioning units 16, designed to maintain the temperature controls within the container 10, which is vitally important for servers and the like. In an embodiment, the container 10 may comprise an awning 17 above the door 13 to protect the doorway from the ingress of rain or other adverse weather conditions.

Figure 2:
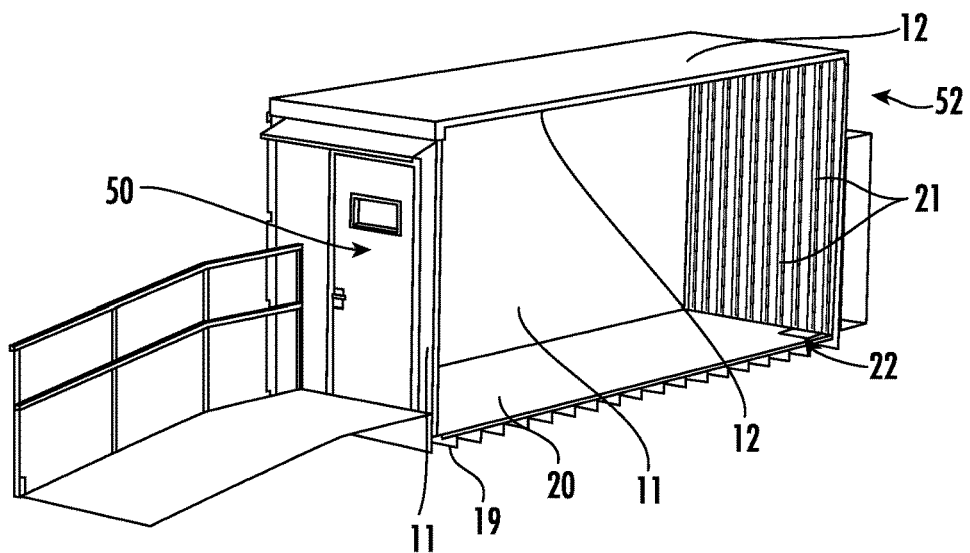
FIG. 2 is a cross-sectional perspective drawing of an exemplary container in an embodiment of the present invention.

Turning to FIG. 2, the interior of the container 10 is shown in cross section. In an embodiment, the container 10 comprises sub-floor cross members 19. In this embodiment, the cross members 19 may comprise a plurality of cross members 19 which are disposed parallel to one another across the length or width of the container 10. In an embodiment, the cross members 19 are disposed in a direction which is perpendicular to the longer of the length or width of the container 10. In an embodiment, the container additionally comprises a wood subfloor 20, optionally treated for sea transit and texture coated, to avoid slippage.

In an embodiment, the interior of the walls 11 and the interior of the roof 12 of the container 10 each comprise perforated or corrugated aluminum. In an embodiment, the walls 11 may be insulated and one or more of the interior portions of the walls 11 may comprise studs 21.

In some embodiments, the height of the container 10 may be approximately 20 feet or 40 feet, though other dimensions are contemplated herein. In an embodiment, the container 10 is equipped with lighting features, which can be disposed on the interior of the container 10, on the skids 30 (discussed below), and/or on the exterior of the container 10. In an embodiment, the container 10 is equipped with lightning protection and fire protection mechanisms. In an embodiment, the container 10 is equipped with security mechanisms, such as a badge scanner.

In an embodiment, shown in FIG. 2, the container 10 comprises an interconnection zone 22. The interconnection zone 22 may comprise penetrations through the floor or lower portion of one or more walls, near the rear 52 of the container. Penetrations through the lower portion of a wall may be parallel with the floor. For example, the interconnection zone 22 may be disposed adjacent the wall that houses the air conditioning units. The interconnection zone 22 comprises, in an embodiment, one or more mechanisms for connecting the container 10 and the equipment contained therein to the related facility it is designed to control.

Figure 3:
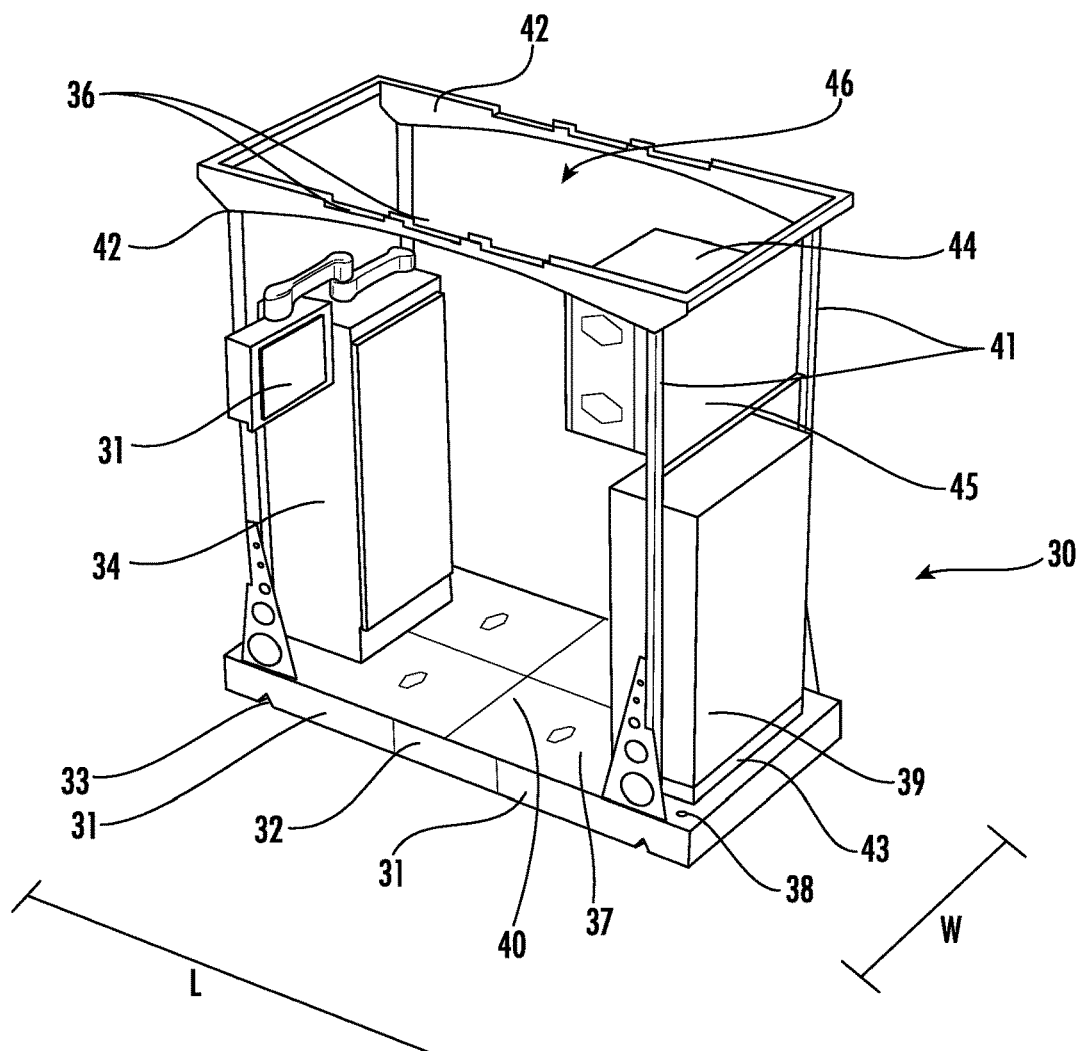
FIG. 3 is perspective drawing of an exemplary skid in an embodiment of the invention.

In an embodiment, the container 10 is adapted to contain a plurality of skids 30. In an embodiment, the container 10 contains five skids 30. An embodiment of a skid 30 is shown in FIG. 3. In an embodiment, the skid 30 generally comprises a base 40, one or more upwardly extending members, panels or posts 41, and a top frame 42. The skid 30 may be generally rectangular, in an embodiment. In an embodiment, the top frame 42 comprises a perimetrical frame with an open central portion 46. In an embodiment, the skid 30 has a length L and a width W and the length L is longer than the width W. In an embodiment, the internal width of the container 10 is slightly larger than the length L of the skid 30, such that each skid 30 can be inserted into the container 10 and installed in a manner which minimizes wasted space.

In an embodiment, the skid 30 may comprise one or more locations for a removable source power egress 31. These locations may be positioned along a perimeter of the base 40 of the skid, in an embodiment. In an embodiment, the skid 30 may comprise one or more removable narrow aisle fork pockets 32 (i.e. for a lift truck or pallet jack), also located along a perimeter of the base 40. In some embodiments, the skid 30 may comprise four or more integrated track rollers 33 or wheels and casters, for movement and transportation of the skid 30 within the container. In an embodiment, the track rollers 33 are mounted on the underside of the base 40 and allow the skid 30 to roll from one location to another along the track. In an embodiment, each of the four corners of each skid 30 comprise leveling pads to secure the skid 30 into a desired location.

Figure 4:
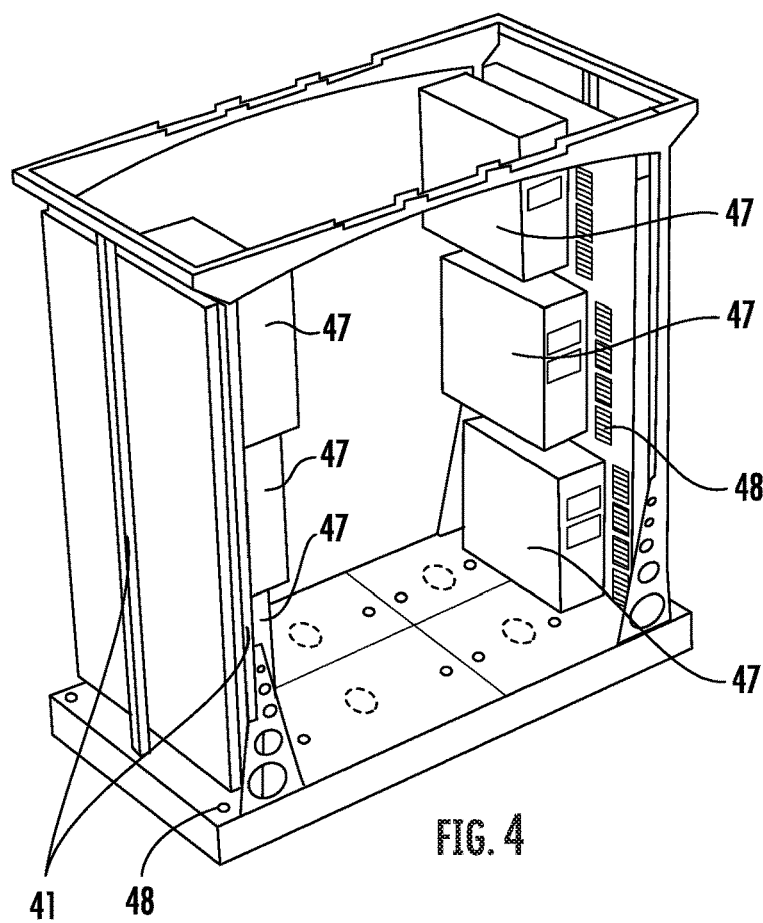
FIG. 4 is perspective drawing of an exemplary skid in an embodiment of the invention.
Figure 5:
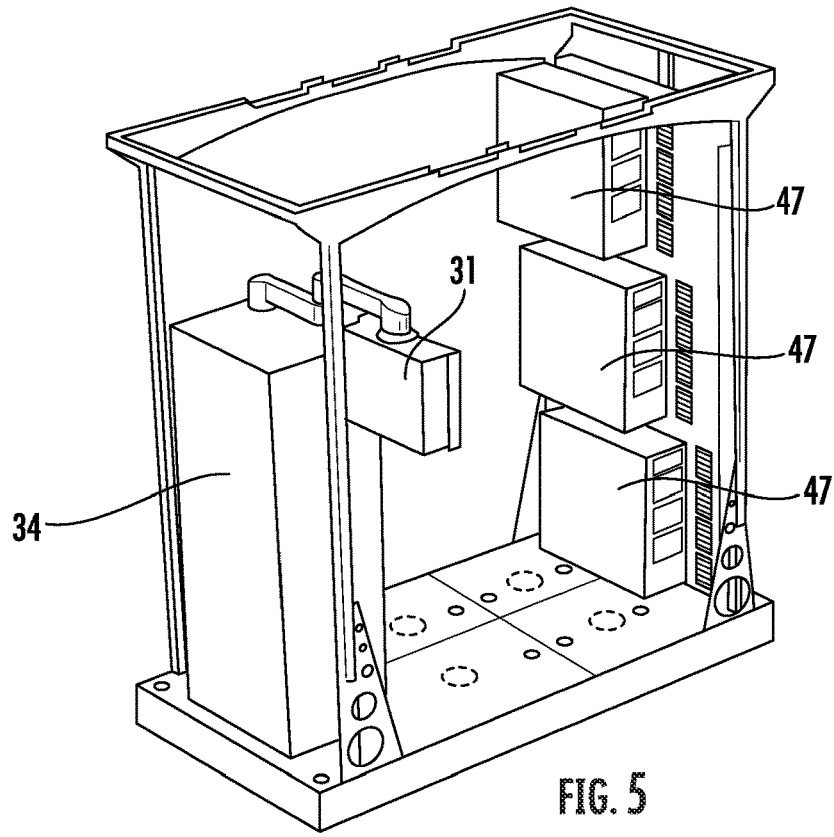
FIG. 5 is perspective drawing of another exemplary skid in an embodiment of the invention.
Figure 6:
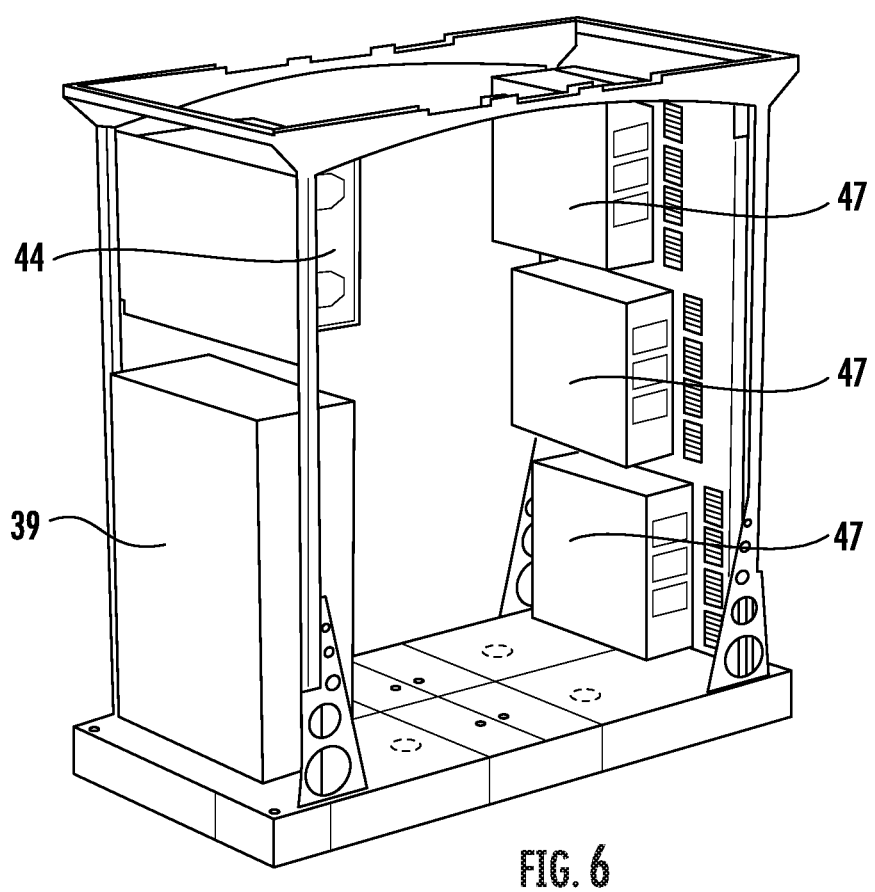
FIG. 6 is perspective drawing of yet another exemplary skid in an embodiment of the invention.

In some embodiments, the skid 30 may comprise one or more control power distribution panels (CPDP) cabinets 34, human-machine interface (HMI) cabinets 35, programmable logic controller-redundancy (PLC-RDN) cabinets 39, network cabinets 44, or remote I/O cabinets (RIO) 47. The various cabinets may be mounted onto the base 40 of a skid 30, optionally alongside an upwardly extending post 41 or panel. In other embodiments, the various cabinets may be mounted onto or between one or more upwardly extending posts 41 or panels. In an embodiment, the one or more cabinets may comprise risers 43, mounting plates 45, or adapters. In some embodiments, one or more cabinets may be mounted above one another, such as is shown in FIG. 4. Another alternate configuration is shown in FIGS. 5 and 6.

In an embodiment, the top frame 42 comprises an overhead rack assembly. In this embodiment, the top frame 42 may comprise one or more integrated raceway slots 36 for overhead interconnections and/or recessed lighting.

In an embodiment, the base 40 of the skid 30 may comprise one or more removeable tile plates 37, for service of power routing. In an embodiment, the base 40 of the skid 30 may comprise one or more corner leveling pads 38. In an embodiment, the base 40, the one or more upwardly extending panels or posts 41, and/or the top frame 42 may comprise one or more integrated cable egresses 48 (through holes), optionally with bristle feed-throughs (shown in FIG. 4).

In an embodiment, the dimensions of the skid 30 may be approximately 90 inches by 40 inches by 94 inches. However, any dimensions that would be functional for the intended purposes are contemplated herein.

In one embodiment, the various cabinets are located on opposite sides of the skid 30, such that a human can walk between the oppositely-located cabinets. In an embodiment, the various cabinets are located adjacent the shorter width W side of the base 40. In the invention, any configuration and combination of cabinets may be installed on a skid 30. The invention should not be limited to any particular configuration.

For example, in an embodiment, a PLC-RDN cabinet 39 and a network cabinet 44 may be disposed on one side of the skid and a CPDP cabinet 34 may be located on the opposite side of the skid, such that a person may walk between the PLC-RDN cabinet 39 and network cabinet 44, on the one hand, and the CPDP cabinet 34, on the other hand. In an embodiment, an HMI cabinet 31 is affixed to and/or positioned above the CPDP cabinet 34. In an embodiment, the HMI cabinet 31 may be positioned on a swivel mount such that it can be turned and positioned for viewing from different locations within the container. In an embodiment, this configuration may be identified as Skid A (shown in FIG. 3).

In another embodiment, up to three RIO cabinets 47, each positioned above another, may be disposed on one side of a skid and up to three RIO cabinets 47 may be located on the opposite side of the skid (shown in FIG. 4). One or more integrated cable egresses 48 (through holes) may be positioned adjacent each RIO cabinet 47. In an embodiment, this configuration may be identified as Skid B.

In an embodiment, each RIO cabinet 47 on a skid 30 will have a different vertical raceway (i.e. the path within the skid which retains the cabling for the cabinet). That is, in an embodiment, each RIO cabinet 47 may be slightly offset from the other RIO cabinets 47 such that they are not vertically aligned. The raceway for the cabling for each cabinet may be similarly offset and not vertically aligned. This is illustrated in FIGS. 4-6. There may be a left, center and right outlet on the top frame 42 which each connect to a particular RIO cabinet location. For example, the left cabling outlet may connect via a raceway to the bottom RIO cabinet. The center cabling outlet may connect via a raceway to the middle RIO cabinet. The right cabling outlet may connect via a raceway to the top RIO cabinet. This allows changes, modifications, and maintenance to be performed on the RIO cabinets easily and without cable confusion.

In yet another embodiment, three RIO cabinets 47, each positioned above another, may be disposed on one side of a skid and a CPDP cabinet 34 may be located on the opposite side of the skid (shown in FIG. 5). In an embodiment, an HMI cabinet 31 is affixed to the CPDP cabinet 34. In an embodiment, this configuration may be identified as Skid C.

In still another embodiment, three RIO cabinets 47, each positioned above another, may be disposed on one side of a skid and a PLC-RDN cabinet 39 and a network cabinet 44 may be disposed on the opposite side of the skid (shown in FIG. 6). The network cabinet 44 may be positioned above the PLC-RDN cabinet 39. In an embodiment, this configuration may be identified as Skid D.

Figure 7:
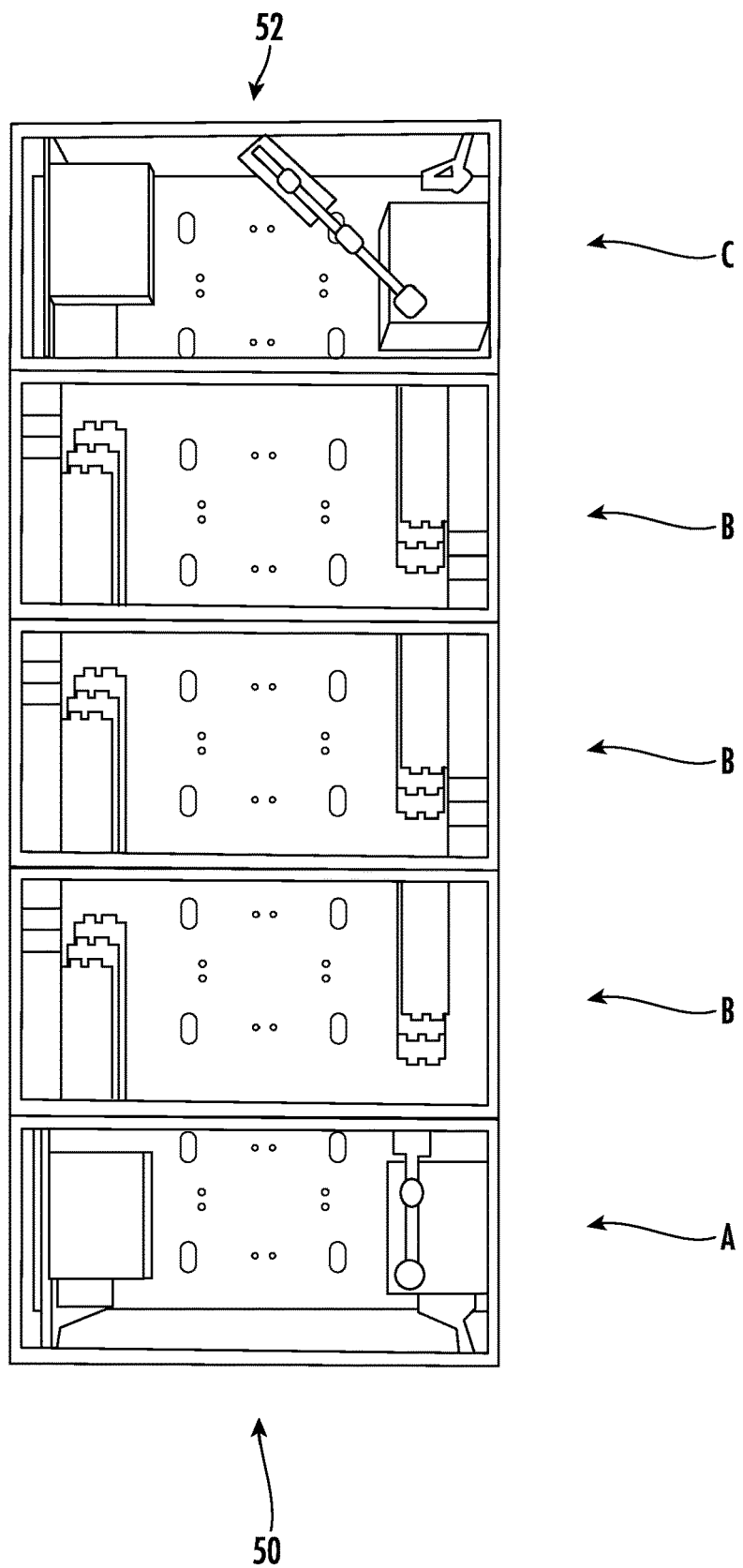
FIG. 7 is a top view of five skids in accordance with an embodiment of the present invention.
Figure 8:
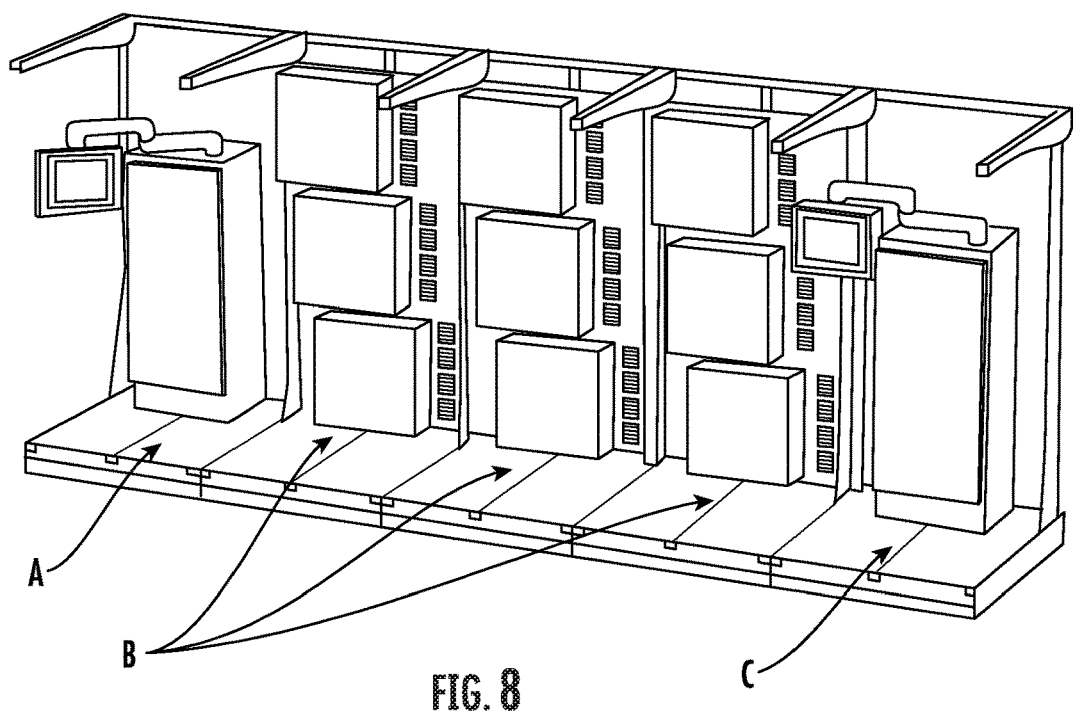
FIG. 8 is a cross-sectional perspective view of five skids in accordance with an embodiment of the present invention.
Figure 9:
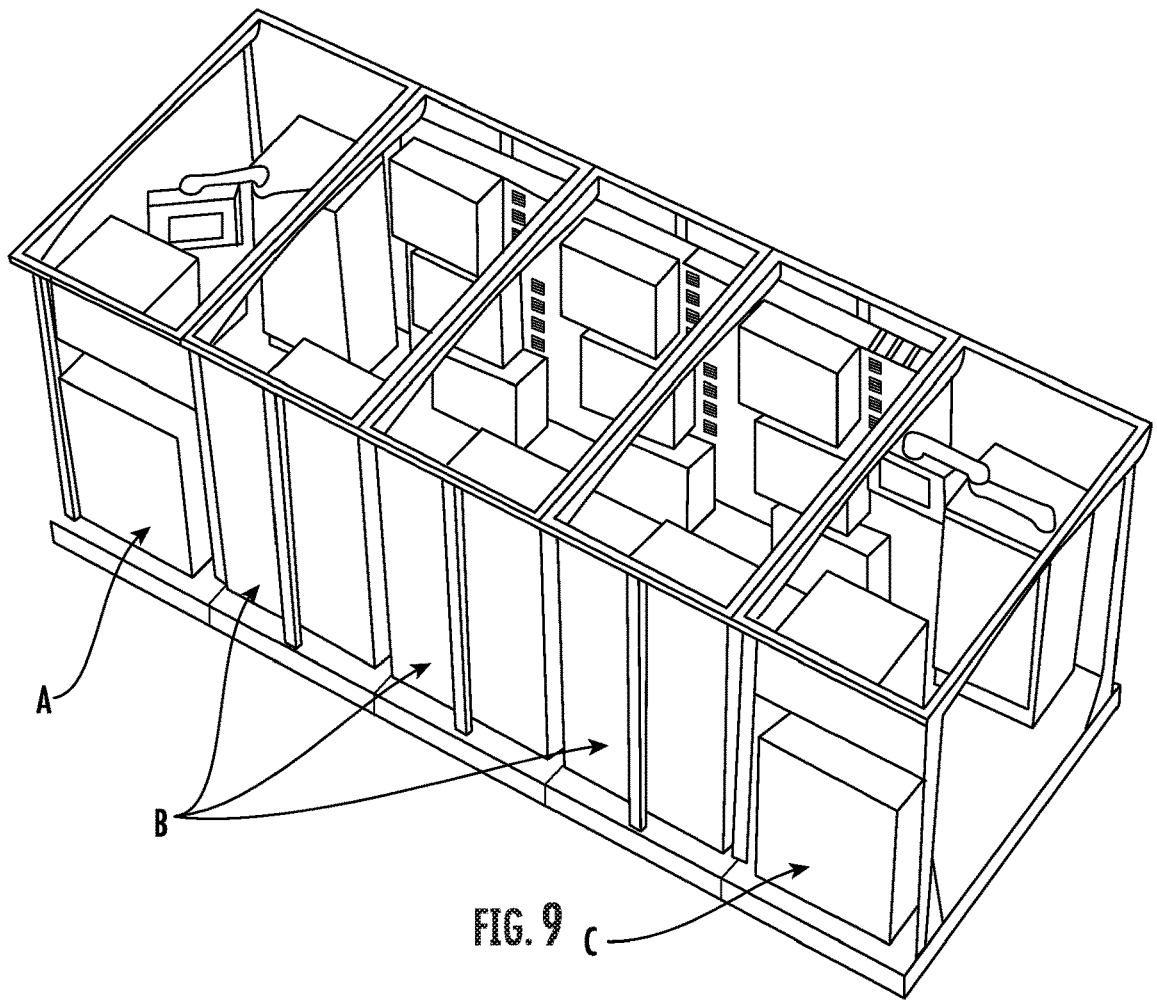
FIG. 9 is a top perspective view of five skids in accordance with an embodiment of the present invention.

FIG. 7 illustrates a top view of a five (5) skids 30, each of which is aligned as if positioned inside a container 10. FIG. 8 illustrates a cross-sectional view of the above-noted five skids 30, though only half of each skid 30 is visible due to the cross-sectional view. FIG. 9 is a dimensional view of the above-noted five skids. In an embodiment, any configurations of individual skids 30 is contemplated by the invention. In an embodiment, each skid 30 is identical and is customized with particular BMS controls equipment.

In an embodiment, the skid 30 closest to the entrance 50 of the container 10 may comprise Skid A, Skid C, or Skid D. In an embodiment, the skid closest to the rear 52 of the container 10 may comprise Skid A, Skid C, or Skid D. Though the illustration in FIG. 7 shows Skid C at the rear 52 of the container 10, it should be understood that Skid A could be disposed at the rear 52 of the container 10. Likewise, although Skid A is shown in FIG. 7 at the front 50 of the container 10, it should be understood that Skid C could be disposed at the front 50 of the container 10. In an embodiment, each of the skids positioned at the front 50 and the rear 52 of the container 10 may comprise Skid A. In an embodiment, each of the skids positioned at the front 50 and the rear 52 of the container 10 may comprise Skid C.

In an embodiment, the skids closest to the rear 52 and the front 50 of the container 10 are each identical and inverted. In an embodiment, the skids closest to the rear 52 and the front 50 of the container 10 each contain redundancy equipment.

In a particular embodiment, the three middle skids may comprise Skid B. In an embodiment, the skids positioned in the middle of the skid arrangement may be customized to fit a customer's needs. For example, positions 2, 3 and 4 may comprise Skid B, Skid C, Skid D, or any combination thereof. In some embodiments, more or less than five skids may be utilized. For example, a container may be configured to hold five skids, but it may only be necessary to contain three or four skids at a given time. Alternatively, a container may be configured to hold six or more skids. In a particular embodiment, a container may be configured to hold ten skids. There is no limit to the number of skids that could be utilized in the present invention.

Figure 10A:
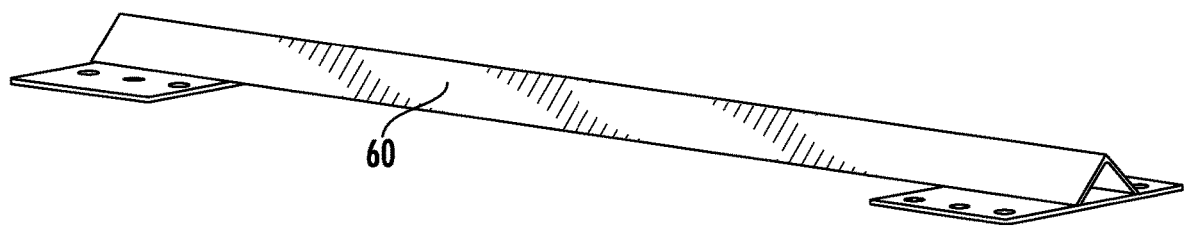
FIG. 10A is a perspective view of a track utilized in an embodiment of the present invention.
Figure 10B:
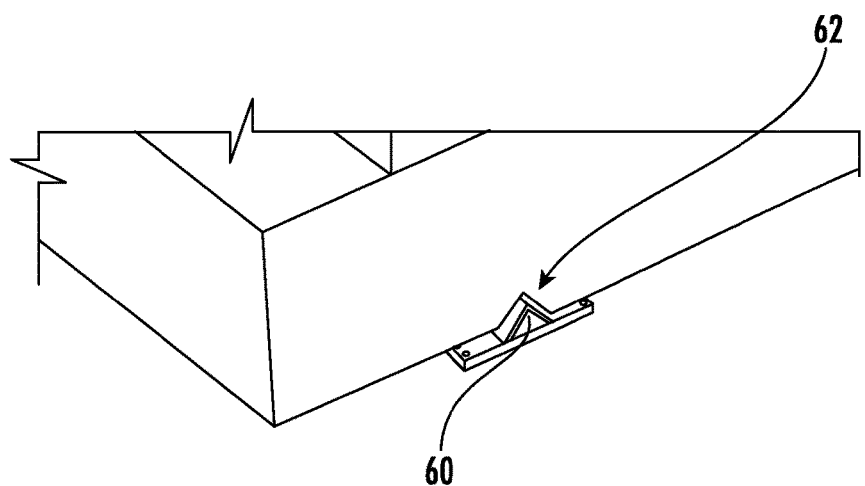
FIG. 10B illustrates a skid positioned atop a track in an accordance with an embodiment of the invention.

In an embodiment, a track system 60 may be positioned within and affixed to the container 10. In an embodiment, the track system 60 may comprise a triangular track (shown in FIG. 10) that can be bolted to the floor of the container 10. In an embodiment, the base of each skid 30 comprises an inversion 62 which corresponds to the shape of the track. For example, the inversion 62 may be triangularly configured to receive the triangular track 60. While the shape of the track and inversion herein are described as triangular, any shape known in the art may be utilized. For example, the track and the inversion may each be semi-circular or square. In any embodiment, the track 60 fits within the inversion 62 of the skid 30 and allows the skid 30 to slide along the track 60. In an embodiment, two tracks 60 are provided such that the skid 30 can be positioned on each track 60 and slid through the container 10. In this embodiment, the base of the skid 30 may comprise two, four, or more inversions 62, spaced and disposed to fit against the track 60.

In an embodiment, in use, the hinged wall 53 is opened to reveal the skid access 57 and tracks 60. Each skid 30 is then inserted into the container 10, aligning the base inversions 62 with the tracks 60. The skid 30 can then be slid along the track to the rear 52 of the container 10. Once each skid 30 is in place, a locking mechanism 64 (shown in FIG. 1B) may be utilized to lock each of the skids 30 in place. The locking mechanism 64 may lock each skid 30 into the container space. In other embodiments, the locking mechanism may lock one skid 30 against another skid 30. In an embodiment, the locking mechanism 64 comprises a steel plate that surrounds and/or stabilizes the base of the skids 30, preventing movement of the skids 30.

As noted above, in an embodiment the skid 30 located nearest the rear 52 of the container 10 is a redundancy PLC/power and network-based skid (a "redundancy skid"). In this embodiment, the redundancy skid may be loaded into the container 10 first. In this embodiment, one or more skids may then be loaded into the container adjacent the redundancy skid. Finally, in this embodiment, the last skid 30 to be loaded into the container 10 may be another redundancy skid. This last skid 30 will be adjacent the entrance 50 into the container.

In an embodiment, the hinged wall 53 is then closed. The door 13 is aligned with the space between the opposite ends of the skids 30, in an embodiment. The door 13 can then be opened and each side of each skid is accessible to a person that passes through the door 13 and into the space between the opposite ends of each skid 30.

In an embodiment, one or more pieces of hardware may need to be upgraded or replaced. In order to do so, the hinged wall 53 may be opened and the first skid 30 may be disconnected and removed. Due to the redundancy skid 30 positioned at the rear 52 of the container 10, this does not pose an issue. The skid 30 that needs to be replaced may then be removed and replaced with a skid 30 containing upgraded or repaired equipment/hardware. The skid 30 positioned at the entrance 50 of the container 10 may then be replaced and reconnected. The actual equipment/hardware may have been prepared or repaired offsite and may have been immediately available for installation. The time frame for installation is significantly reduced and the risks associated with losing a redundant source are minimized.

The accompanying figures are provided for explanatory purposes and may not show all components described herein with respect to embodiments of the system. In addition, those components that are illustrated are not necessarily drawn to scale.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A portable container system comprising:
   a container which comprises:
      a floor;
      four upwardly-extending sidewalls, wherein at least one of the sidewalls is a hinged sidewall to allow the hinged sidewall to open outwardly; and
      a top wall; and
   a plurality of skids contained within the container, wherein each skid comprises:
      a base and one or more upwardly extending members; and
      one or more cabinets mounted on the base or the one or more upwardly extending members, wherein the one or more cabinets comprise: control power distribution panel cabinets, human-machine interface cabinets, programmable logic controller-redundancy cabinets, network cabinets, or remote I/O cabinets,
   wherein each skid comprises a first end and a second, horizontally opposite end, wherein each skid comprises a central portion between the first end and the second, horizontally opposite end, wherein each skid is configured to permit a human to walk through the central portion.

2. The portable container system of claim 1 additionally comprising a hinged door in the hinged sidewall which is sized and configured for a human to open, close and pass through.

3. The portable container system of claim 1 wherein the container is configured to be installed exterior to a building and manage the building controls within the building.

4. The portable container system of claim 1 wherein the container is configured to be installed atop a roof of a building and manage the building controls within the building.

5. A portable container system comprising:
   a container which comprises:
      a floor;
      four upwardly-extending sidewalls, wherein at least one of the sidewalls is a hinged sidewall to allow the hinged sidewall to open outwardly; and
      a top wall; and
   a plurality of skids disposed within the container, each skid of the plurality of skids having a first end and a second, horizontally opposite end, a base, and one or more upwardly extending members, wherein:
      a first skid is disposed adjacent the hinged sidewall and comprises a programmable logic controller-redundancy cabinet and a network cabinet each mounted on the first end of the first skid and a control power distribution panel cabinet mounted on the second end of the first skid;
      at least one second skid is disposed adjacent the first skid and comprises at least one remote I/O cabinet mounted on the first end of the second skid and at least one remote I/O cabinet mounted on the second end of the second skid; and
      a third skid is disposed furthest from the hinged sidewall and comprises at least one remote I/O cabinet mounted on the first end of the third skid and at least one of a programmable logic controller-redundancy cabinet or a control power distribution panel cabinet mounted on the second end of the third skid.

6. A portable container system comprising:
   a container which comprises:
      a floor;
      four upwardly-extending sidewalls, wherein at least one of the sidewalls is a hinged sidewall to allow the hinged sidewall to open outwardly; and
      a top wall; and
   a plurality of skids contained within the container, wherein each skid comprises:
      a base and one or more upwardly extending members; and
      one or more cabinets mounted on the base or one or more upwardly extending members, wherein the one or more cabinets comprise: control power distribution panel cabinets, human-machine interface cabinets, programmable logic controller-redundancy cabinets, network cabinets, or remote I/O cabinets,
      wherein each skid comprises a first end and a second, horizontally opposite end, and wherein at least one cabinet is mounted on the first end of each skid and at least one cabinet is mounted on the second end of each skid, such that a human may walk through a central portion of each skid, between the at least one cabinet mounted on the first end and the at least one cabinet mounted on the second end.

7. The portable container system of claim 6 wherein a first skid comprises a programmable logic controller-redundancy cabinet and a network cabinet each mounted on the first end of the first skid and a control power distribution panel cabinet mounted on the second end of the first skid.

8. The portable container system of claim 7 wherein a human-machine interface cabinet is affixed to the control power distribution panel cabinet on the first skid.

9. The portable container system of claim 7 wherein the first skid is disposed closest to the hinged sidewall.

10. The portable container system of claim 7 wherein the first skid is disposed furthest from the hinged sidewall.

11. The portable container system of claim 6 wherein a second skid comprises at least one remote I/O cabinet mounted on the first end of the second skid and at least one remote I/O cabinet mounted on the second end of the second skid.

12. The portable container system of claim 6 wherein a third skid comprises at least one remote I/O cabinet mounted on the first end of the third skid and a control power distribution panel cabinet mounted on the second end of the third skid.

13. The portable container system of claim 12 wherein the third skid is disposed closest to the hinged sidewall.

14. The portable container system of claim 12 wherein the third skid is disposed furthest from the hinged sidewall wall.

15. The portable container system of claim 6 wherein a fourth skid comprises at least one remote I/O cabinet mounted on the first end of the fourth skid and a programmable logic controller-redundancy cabinet mounted on the second end of the fourth skid.

16. The portable container system of claim 15 wherein the fourth skid is disposed closest to the hinged sidewall.

17. The portable container system of claim 15 wherein the fourth skid is disposed furthest from the hinged sidewall.

18. The portable container system of claim 6 wherein the skids are aligned within the container such that the first end of each skid is aligned and the second end of each skid is aligned.

19. The portable container system of claim 18 wherein a human can walk through a central portion of the skids, between the first end and the second end of each.

* * * * *